United States Patent [19]

Saka et al.

[11] Patent Number: 4,648,128
[45] Date of Patent: Mar. 3, 1987

[54] MICROWAVE INTEGRATED CIRCUIT IMMUNE TO ADVERSE SHIELDING EFFECTS

[75] Inventors: Hiroshi Saka, Osaka; Toshihide Tanaka, Ikoma, both of Japan

[73] Assignee: Matsushita Electric Industrial Co., Ltd., Japan

[21] Appl. No.: 615,514

[22] Filed: May 30, 1984

[30] Foreign Application Priority Data

May 31, 1983 [JP] Japan .................................. 58-97096
May 31, 1983 [JP] Japan .................................. 58-97097

[51] Int. Cl.⁴ .......................... H04B 1/10; H04B 1/26
[52] U.S. Cl. .................................... 455/301; 455/302; 455/327; 455/317; 334/85; 361/424
[58] Field of Search ................................ 455/300–302, 455/317, 318, 325–328, 349; 361/422, 424; 334/85

[56] References Cited

U.S. PATENT DOCUMENTS

| | | | |
|---|---|---|---|
| 3,643,168 | 2/1972 | Manicki | 455/300 |
| 3,754,170 | 8/1973 | Tsuda et al. | 455/301 |
| 3,852,670 | 12/1974 | MA | 455/301 |
| 4,041,399 | 8/1977 | Tsuda | 455/301 |
| 4,214,212 | 7/1980 | Dipietromaria | 361/422 |
| 4,219,779 | 8/1980 | Shinkawa et al. | 455/325 |
| 4,352,209 | 9/1982 | MA | 455/301 |
| 4,353,132 | 10/1982 | Saitoh et al. | 455/327 |
| 4,461,041 | 7/1984 | Dobrovolny | 455/328 |

FOREIGN PATENT DOCUMENTS

| | | | |
|---|---|---|---|
| 111710 | 9/1979 | Japan | 455/302 |
| 21673 | 2/1980 | Japan | 455/317 |
| 10507 | 1/1982 | Japan | 455/302 |

*Primary Examiner*—Jin F. NG
*Attorney, Agent, or Firm*—Lowe, Price, Leblanc, Becker & Shur

[57] ABSTRACT

A microwave integrated circuit comprises a shield case having a pair of opposed first and second end walls, a pair of side walls and top and bottom walls, and a dielectric substrate on the bottom wall. First and second interconnected integrated circuit portions are arranged on the substrate between the first and second end walls. An input strip line is arranged on the substrate, the strip line having one end coupled to the input of the first integrated circuit portion and the other end terminating at a position spaced from the first end wall by a distance approximately equal to an integral multiple of the half wavelength of a signal propagating in the shield case. An elongated coupling member is disposed in parallel with the first end wall, the coupling member extending from the other end of the input strip line to an external circuit.

45 Claims, 16 Drawing Figures

MICROWAVE INTEGRATED CIRCUIT IMMUNE TO ADVERSE SHIELDING EFFECTS

BACKGROUND OF THE INVENTION

The present invention relates to a microwave integrated circuit.

In conventional microwave integrated circuits which comprise a plurality of interconnected circuits of different functions, the operating characteristics of the individual circuits are not reflected faithfully in the overall operating characteristic of the integrated circuit due to the shielding effect of a casing in which the circuits are housed.

Specifically, in a microwave integrated circuit frequency converter which comprises an amplifier, mixer and local oscillator, the operating characteristics of the individual circuits can be fully exploited if the interconnecting parts of the converter are appropriately designed. However, the shielding effect of the casing adversely affects the various operating factors including input VSWR, noise figure, leakage of local oscillator output, image suppresion ratio and conversion gain. In a local oscillator having a dielectric resonator, the resonator tends to couple with a particular waveguide resonance mode of the shield case to such a degree that the oscillator ceases to generate an output.

SUMMARY OF THE INVENTION

An object of the present invention is therefore to provide a microwave integrated circuit which is immune to adverse effects produced by the shield case in which the individual components of the integrated circuit are housed.

According to a feature of the invention, a microwave integrated circuit comprises a shield case having a pair of opposed first and second end walls, a pair of side walls and top and bottom walls, and a dielectric substrate on the bottom wall. First and second interconnected integrated circuit portions are arranged on the substrate between the first and second end walls. An input strip line located on the substrate has first and second ends respectively coupled to the input of the first integrated circuit portion and terminated at a position spaced from the first end wall by a distance approximately equal to an integral multiple of half wavelength of a signal propagating in the shield case. An elongated coupling member disposed parallel with first end wall, the extends from the other end of theinput strip line to an external circuit.

A connection of the input strip line and the elongated coupling member at the half-wavelength point eliminates the effect of the shield case on the input impedance of the first integrated circuit portion, eliminating the need to take the shield casing into account in the design of the integrated circuit.

BRIEF DESCRIPTION OF THE DRAWINGS

The present invention will be described in further detail with reference to the accompanying drawings, in which:

FIG. 1a is a cross-sectional view of a microwave integrated circuit as seen from above and FIG. 1b is a cross-sectional view taken along the line 1b—1b of FIG. 1a;

FIG. 3b is a cross-sectional view taken along the line 3b-3b of FIG. 3a;

DETAILED DESCRIPTION

Figure 1A:
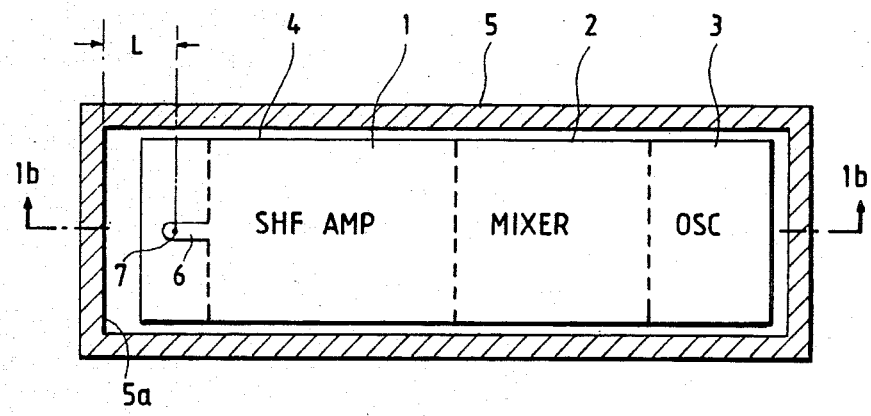
Figure 1B:
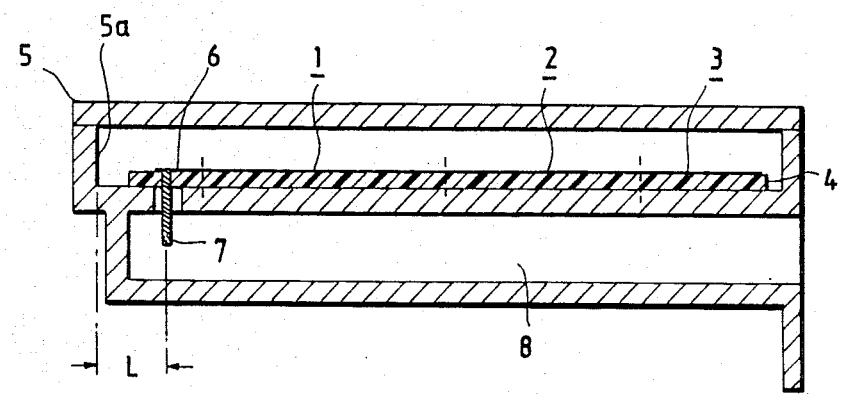

In FIGS. 1a and 1b, a microwave integrated-circuit frequency converter according to the present invention comprises a super high frequency amplifier 1, a frequency mixer 2 and a local oscillator 3 all of which are mounted on a common dielectric substrate 4 formed of a material such as alumina or Teflon glass fibers and are connected in series within a common shield case 5. An input strip line 6 is located in an unoccupied area of the dielectric substrate 4. First and second ends of the strip line 6 are respectively connected to the input to SHF amplifier 1 and to a coupling element 7 which extends downward through the substrate 4 into a waveguide 8, which is located below the integrated circuit, to couple an input microwave signal to amplifier 1. The coupling element 7 is located in a position spaced a distance "L" from an adjacent end wall 5a of the shield case 5, the distance L being approximately equal to an integral multiple of the half wavelength of the signal propagating through the case 5 or an integral multiple of the half wavelength of the signal generated by the local oscillator 3.

The above noted half-wavelength spacing has an important advantage in that the input impedance of the SHF amplifier 1 is rendered constant regardless of whether the case 5 is provided or not. This eliminates the need to take the case 5 into consideration when the input impedance is calculated. As a result, the design of the SHF amplifier 1 is simplified and the operating characteristics of the individual constitutents of the integrated circuit can be reflected faithfully in the overall operating characteristic of the integrated circuit.

At the same time the amount of undesired spurious emission from the local oscillator 3 to the waveguide 8 is also reduced.

The parallel arrangement of the waveguide 8 and the integrated circuit allows the microwave frequency converter to have a relatively small longitudinal dimension and enables the waveguide portion to be longer to achieve a small transmission loss.

In a further alternative embodiment, the coupling element 7 is connected to an end of a coaxial cable to receive input microwave signals.

Figure 2:
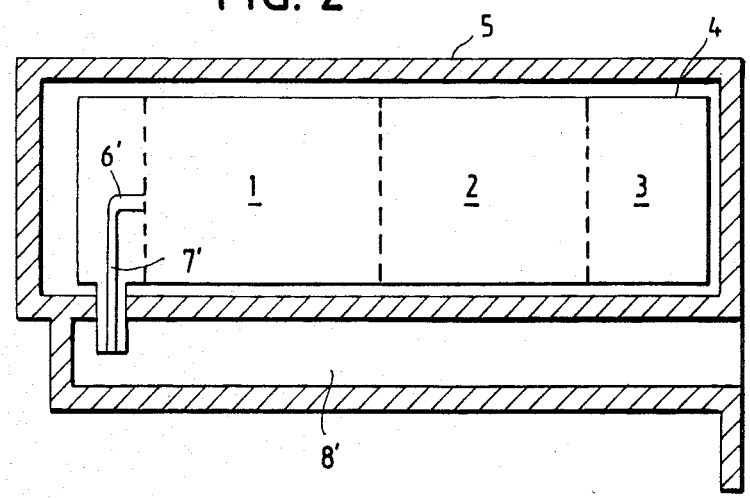
FIG. 2 is an illustration of an alternative embodiment of the invention.

The coupling element 7 may alternatively be formed by a segment 7' which is disposed on the unoccupied area of the dielectric substrate 4 and through an extension of the substrate 4, as shown in FIG. 2, and extends to the waveguide 8' which is provided on a lateral side of the case 5.

Figure 3A:
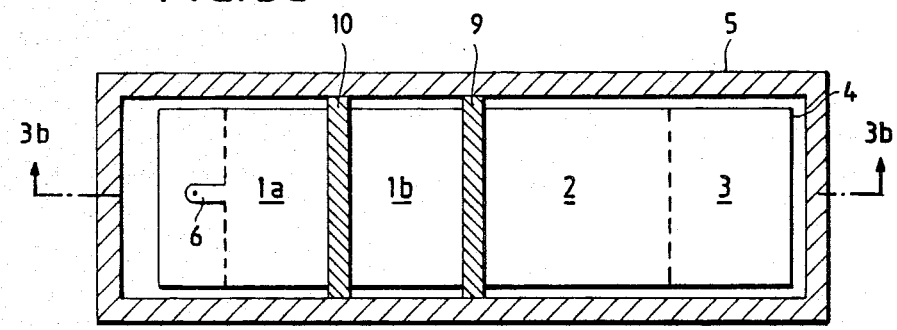
FIG. 3a is a cross-sectional view of a modified embodiment of the invention.
Figure 3B:
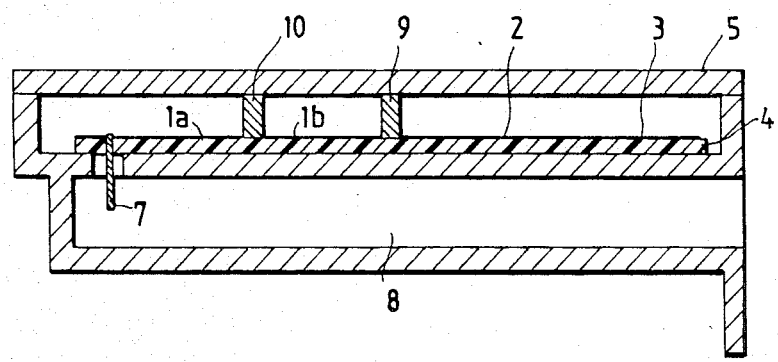

FIGS. 3a and 3b are illustrations of another embodiment of the invention in which parts corresponding to those in FIGS. 1a and 1b are marked with like numerals. This embodiment differs from the previous embodiment in that the SHF amplifier 1 and frequency mixer 2 are spatially separated by a conductive partition 9 and the SHF amplifier 1 comprises a first, preamplifier stage 1a and a second, next amplifier stage 1b to provide a higher amplification gain. These successive amplifier stages are spatially divided from each other by a conductive partition 10. The partition 9 effectively eliminates a leakage path with otherwise exists between the local oscillator 3 output and the waveguide 8 to thereby further reduce the undesired spurious emission. The partition 9, on the other hand, effectively utilizes the operation of amplifier 1 by cutting off a feedback path which otherwise may exist from the output of the second amplifier stage 1b to the input of the first stage 1a.

Figure 4A:
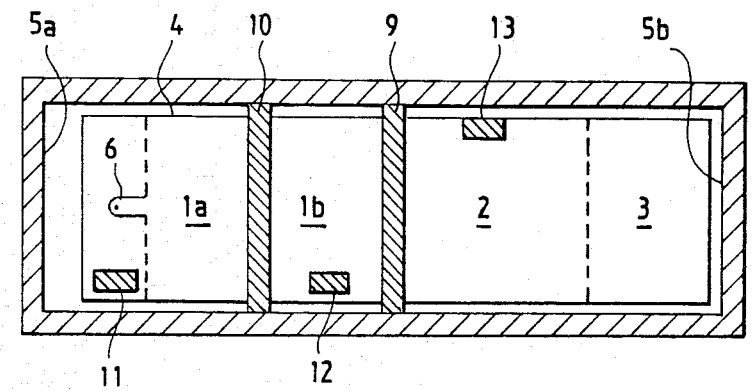
FIGS. 4a and 4b are illustrations of a further modified embodiment of the invention.
Figure 4B:
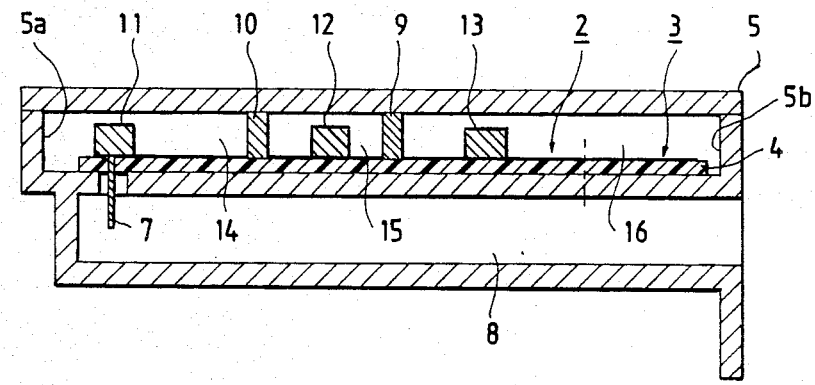

FIGS. 4a and 4b are illustrations of a further modification of the present invention which is generally similar to that shown in FIGS. 3a and 3b except that it includes emission absorbing blocks 11, 12 and 13 formed of ferrite rubber or the like. The block 11 is located in a chamber 14 which subsists between wall 5a and partition 10 and is shared with the first amplifier stage 1a. Block 11 is adjacent one side wall of the case 5 remote from the signal travelling path. In chamber 15, defined between partitions 9 and 10, are located block 12 and the second amplifier stage 1b. Block 12 is likewise located in a position adjacent one side wall of the shield case 5 remote from the signal travelling path. In a chamber 16, defined between the partition 9 and an end wall 5b of case 5, are third emission absorbing block 13 local oscillator 3.

In addition to the advantages provided by the previous embodiments, the emission absorbing blocks 11, 12 and 13 absorb undesired emission which are generated in the respective chambers due to the provision of the shield partitions 9 and 10. Emission absorbing blocks 11–13 stabilize the input VSWR and the gain versus frequency characteristic of the SHF amplifier 1 and the conversion-loss and image signal suppression ratio versus frequency characteristics of the frequency mixer 2 and eliminate undesirable resonance characteristics, while at the same time ensuring that the local oscillator 3 supplies a sufficient amount of energy to the frequency mixer 2. The emission absorbing blocks 11 and 12 further reduce the amount of undesirable spurious emissions from the local oscillator 3 to the waveguide 8.

Figure 5A:
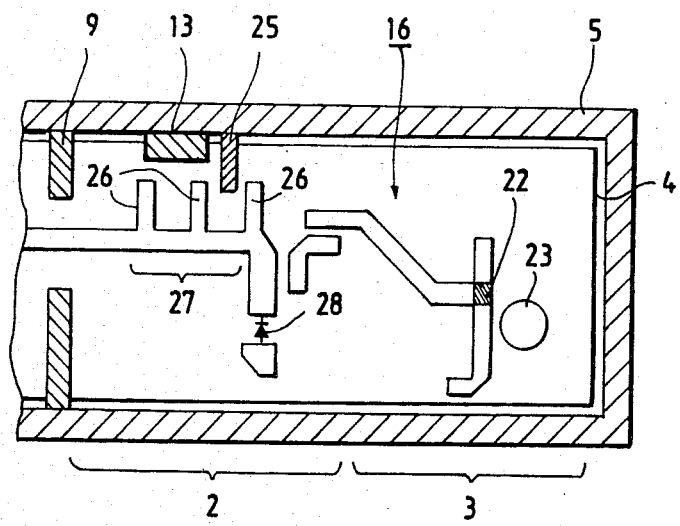
FIGS. 5a and 5b are illustrations of a specific form of the embodiment of FIGS. 4a, 4b.
Figure 5B:
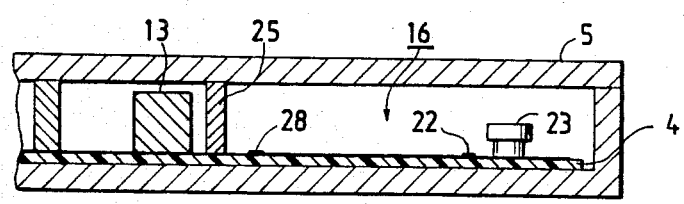

FIGS. 5a and 5b are illustrations of a practical form of the embodiment of FIGS. 4a and 4b. The local oscillator 3 is formed by a GaAs field-effect transistor 22 and a dielectric resonator 23 located adjacent thereto, and the mixer 2 comprises an image signal rejection filter 27 formed by a set of three open-ended stubes 26 and a mixer diode 28. The emission absorbing block 13 is secured to an inner side wall of the case 5 proximate the ends of stubs 26 to suppress a particular waveguide mode of the case 5 which would otherwise couple with the rejection filter 27. The proximate location of the absorbing block 13 to the rejection filter 27 has further advantageous effects of suppressing the coupling of the waveguide mode of the case with the rejection filter 27 and minimizing the undesired effects of the case 5 on the conversion loss characteristic of the mixer 2 and on the image suppression performance of the filter 27. Since the absorbing block 13 is located remote from the dielectric resonator 23, the latter is not affected by the absorption effect of the block 13.

Undesired coupling of the waveguide mode with the dielectric resonator 23 can be eliminated with the use of a metal block 25 located in proximity to the rejection filter 26. The metal block 25 extends between the dielectric substrate 4 and the top wall of the case 5. With the chamber 16 measuring 60 mm × 30 mm × 9 mm and the dielectric resonator 23 being located approximately 14 mm from the lower right corner of the chamber 16, the metal block 25 has dimensions of 8 mm × 6 mm × 2 mm as measured in the vertical, transverse and longitudinal directions of the case and is located a distance of approximately 17 mm from the upper left corner of the chamber so that it projects from the side wall of the case. This ensures normal operation of the local oscillator 3; it has been confirmed that the current flowing through the mixer diode 28 is at a normal level.

Figure 6A:
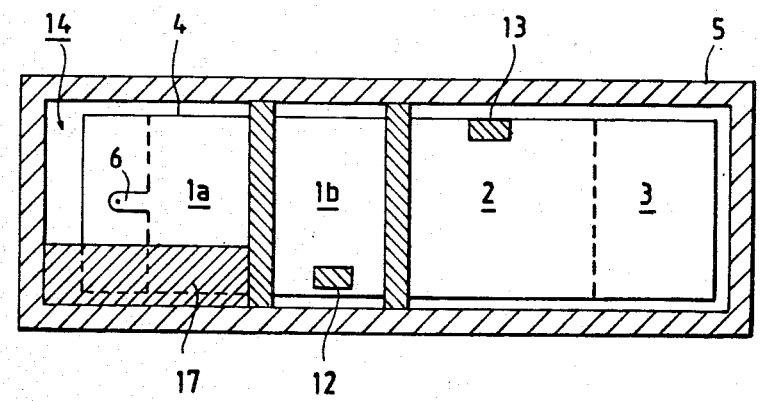
FIGS. 6a and 6b are illustrations of a further modification of the present invention.
Figure 6B:
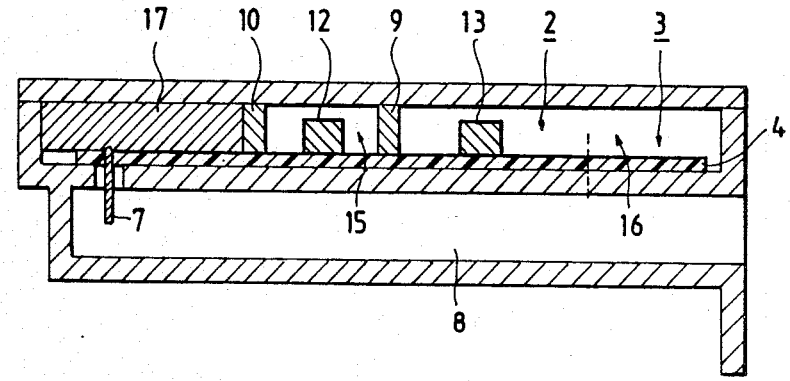
Figure 7A:
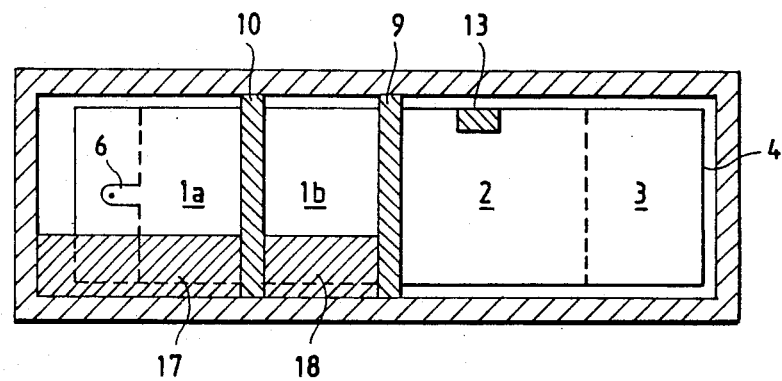
FIG. 7a and 7b are illustrations of a modified form of the embodiment of FIGS. 6a, 6b.
Figure 7B:
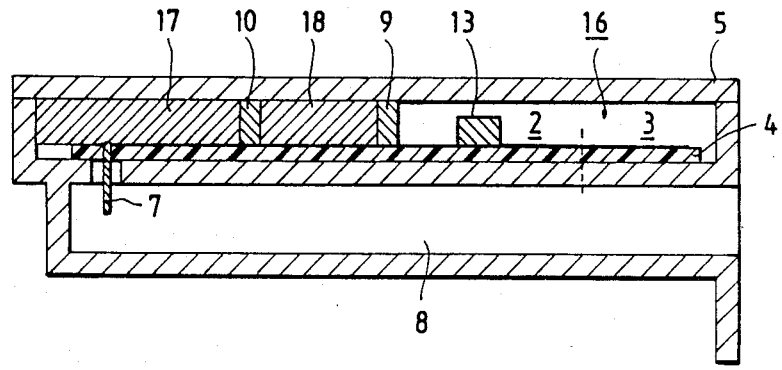

A further modification of the present invention illustrated in FIGS. 6a and 6b is similar to the embodiment of FIGS. 4a, 4b except that a conductive block 17 replaces emission absorbing block 11 in the chamber 14; block 17 occupies a lateral portion of chamber 14 to reduce the effective width of the chamber. The reduction of the transverse dimension of the SHF first amplifier stage 1a shifts in the undesirable resonance frequency to a point outside the bandwidth of the MIC frequency converter to eliminate undesirable effects on the input VSWR and gain versus frequency characteristics and prevents a reduction in the noise figure of the frequency converter. It has been confirmed that a 7-mm wide metal block 17 is a shield case operating in the range between 11.7 GHz and 12.5 GHz, with dimensions 30 mm wide, 9 mm high and 23.5 mm long caused an undesirable resonance point shift from 12.5 GHz to 12.9 GHz and a noise figure reduction from 0.1 to 0.2 dB. A metal block 18 may also be provided in the chamber 15, as shown in FIGS. 7a and 7b instead of the emission absorbing block 12 of FIGS. 6a, 6b to shift the undesirable resonance peak to a point outside the bandwidth of the MIC frequency converter. This diminishes the effect of the resonance which would adversely affect the operating performance of the converter including the input VSWR and frequency response and the noise figure versus frequency characteristic.

Figure 8:
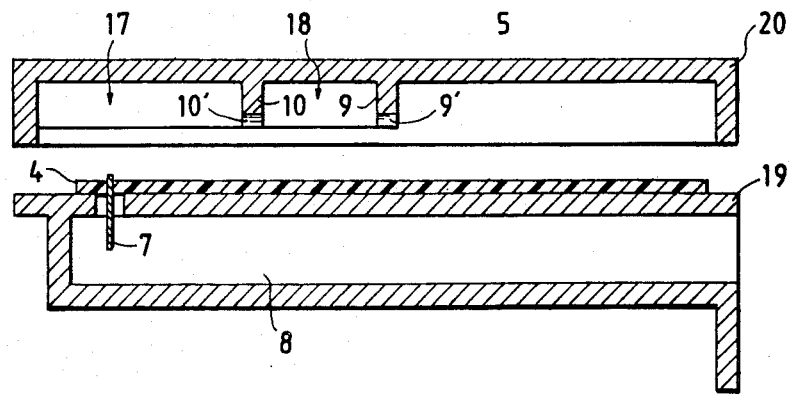
FIG. 8 is a cross-sectional view of another embodiment of the invention in which the integrated circuit is shown separated from the lower waveguide section.
Figure 9:
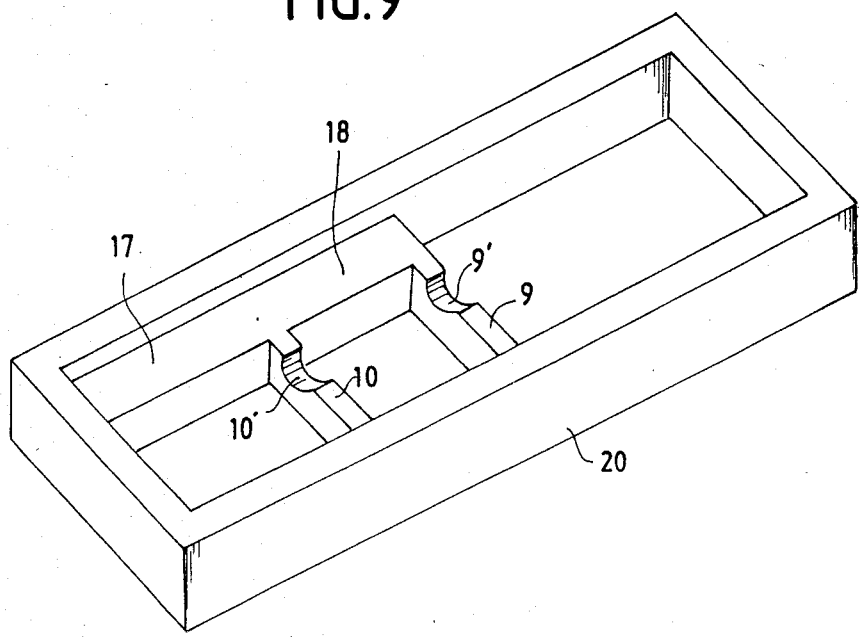
FIG. 9 is a perspective view of the shield casing of FIG. 8.

A specific version of the embodiment of FIGS. 7a, 7b is shown in FIGS. 8 and 9. The waveguide 8 has a top wall 19 which also serves as a bottom wall of the shield case 5. The case 5 is a one-piece unit 20 secured to the top wall 19 of the waveguide 8. In FIG. 9, the shield partitions 9 and 10 are formed with recesses 9' and 10', respectively, to allow the interstage section of the strip line of the integrated circuit to pass therethrough. Each of these recesses has a width greater than approximately twice the width of the interstage strip-line section and has a depth approximately three times greater than its thickness. This construction facilitates assemblage of MIC frequency coverters and provides uniformity in manufacture.

Figure 10:
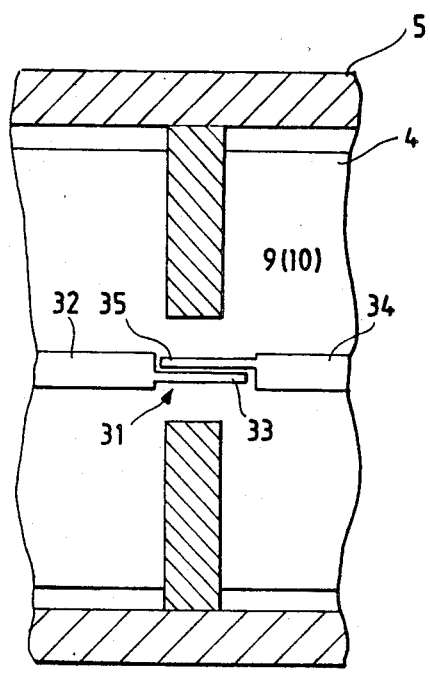
FIG. 10 is a sectional view of an interconnecting strip line having a DC decoupling section.

In a further preferred embodiment, each interstage section of the strip line includes a DC decoupler 31 FIG. 10. A strip-line section 32 extending from the previous stage output terminates with a quarter wavelength coupling portion 33. A strip-line coupling portion 34 extending from the input of the next stage likewise terminates with a greater wavelength portion 35; the guarter wavelength portions 33 and 35 being disposed in an interdigital configuration. Each of the coupling portions 33 and 35 has a quarter wavelength of the signal that travels along the strip-line sections 32 and 34. The interdigital configuration causes the characteristic impedance of the strip-line sections to be less influenced by the shielding effect of the partitions 9 and 10.

What is claimed is:

1. A microwave frequency converter comprising:
   a shield casing having a pair of opposed first and second end walls, a pair of opposed side walls, and top and bottom walls;
   a dielectric substrate on said bottom wall;
   a super high frequency amplifier, a mixer and a local oscillator all of which are connected and arranged in the order named on said dielectric substrate between said first and second end walls;
   an input strip line disposed on said substrate, the strip line having one end coupled to the input of said amplifier and the other end terminating at a position spaced from said first end wall by a distance approximately equal to an integral multiple of the half wavelength of a signal propagating in said shield casing; and
   an elongated coupling member disposed in parallel with said first end wall, the coupling member extending from the other end of said input strip line to an external circuit.

2. A microwave frequency converter as claimed in claim 1, further comprising a waveguide connected in use between said elongated coupling member and said external circuit, said waveguide being disposed parallel with the bottom wall of said shield casing, said waveguide having an opening located adjacent to said second end wall.

3. A microwave frequency converter as claimed in claim 1, further comprising a conductive partition disposed in said shield casing between said amplifier and said mixer.

4. A microwave frequency converter as claimed in claim 3, wherein said amplifier and said mixer are connected by a strip line having a DC decoupling portion extending through said first partition, said DC decoupling portion comprising a pair of interdigitally disposed sections each having a dimension substantially equal to the quarter wavelength of a signal propagating on said strip line.

5. A microwave frequency converter as claimed in claim 3, wherein said amplifier comprises first and second successively connected amplifier stages, further comprising a second conductive partition disposed in said casing between said first and second amplifier stages.

6. A microwave frequency converter as claimed in claim 5, further comprising a block of a material absorptive of electromagnetic radiation located in the space in which said second amplifier stage is disposed to absorb undesired electromagnetic radiation.

7. A microwave frequency converter as claimed in claim 5, further comprising a block of electrically conductive electric shielding material extending between said first and second conductive partitions adjacent to one of said side walls, said second amplifier stage and local oscillator being respectively located in first and second spaces respectively having first and second transverse dimensions, the first transverse dimension of the first space in which said second amplifier stage is located being smaller than the transverse dimension of the space in which said local oscillator is disposed.

8. A microwave frequency converter as claimed in claim 5, wherein said end walls, side walls and top wall and said first and second conductive partitions are formed into a one-piece construction.

9. A microwave frequency converter as claimed in claim 5, wherein said first and second amplifier stages are connected by a strip line having a DC decoupling portion extending through said first partition, said DC decoupling portion comprising a pair of interdigitally disposed sections each having a dimension substantially equal to the quarter wavelength of a signal propagating on said strip line.

10. A microwave frequency converter as claimed in claim 5, wherein said mixer includes an image signal rejection filter, further comprising a block of a material absorptive of electromagnetic radiation located adjacent said rejection filter.

11. A microwave frequency converter as claimed in claim 10, further comprising a block of conductive material located adjacent said rejection filter for suppressing the amount of coupling between said local oscillator and a resonance mode of said shield casing.

12. A microwave frequency converter as claimed in claim 5, further comprising a block of electrically conductive electric shielding material extending between said first end wall and said first conductive partition adjacent to one of said side walls, said first amplifier stage and local oscillator being respectively located in first and second spaces respectively having first and second transverse dimensions, the first transverse dimension of the first space in which said first amplifier stage is located being smaller than the second transverse dimension of the second space in which said local oscillator is disposed.

13. A microwave frequency converter as claimed in claim 12, further comprising a block of electrically conductive electric shielding material extending between said first and second conductive partitions adjacent to one of said side walls, the second amplifier stage being located in a third space having a third transverse dimension, the third transverse dimension of the third space in which said second amplifier stage is located being smaller than the second transverse dimension of the second space in which said local oscillator is disposed.

14. A microwave frequency converter as claimed in claim 13, wherein said end walls, side walls and top wall, said first and second conductive partitions, and said conductive blocks are formed as a one-piece construction.

15. A microwave frequency converter as claimed in claim 5, further comprising a block of a material absorptive of electromagnetic radiation located in the space in which said first amplifier stage is disposed to absorb undesired electromagnetic radiation.

16. A microwave frequency converter as claimed in claim 15, further comprising a block of a material absorptive of electromagnetic radiation located in the space in which said second amplifier stage is disposed to absorb undesired electromagnetic radiation.

17. A microwave frequency converter as claimed in claim 16, wherein said mixer includes an image signal rejection filter, further comprising a block of a material absorptive of electromagnetic radiation located adjacent said rejection filter.

18. A microwave frequency converter as claimed in claim 17, further comprising a block of conductive material located adjacent said rejection filter to suppress the amount of coupling between said local oscillator and a resonance mode of said shield casing.

19. A microwave frequency converter comprising:
an electrically conductive electric shield casing;
a dielectric substrate in said shield casing;
a super high frequency amplifier having first and second successive stages, a mixer and a local oscillator all of which are connected and arranged in the order named on said dielectric substrate between first and second electrically conductive electric shielding end walls of said shield casing, the oscillator and amplifier being located on opposite sides of the mixer;
a first electrically conductive electric shielding partition disposed in said casing between spaces where said first and second amplifier stages are located;
a second electrically conductive electric shielding partition disposed in said casing between spaces where said amplifier and said mixer are located; and
a block of a material absorptive of electromagnetic radiation located in the space in which said first amplifier stage is disposed for absorbing undesired electromagnetic radiation.

20. A microwave frequency converter as claimed in claim 19, further comprising a second block of a material absorptive of electromagnetic radiation located in the space in which said second amplifier stage is dispoed for absorbing undesired electromagnetic radiation.

21. A microwave frequency converter as claimed in claim 19, wherein said end walls, side walls, top wall and said first and second electrically conductive electric shield partitions are formed as a one-piece construction.

22. A microwave frequency converter as claimed in claim 19, wherein said first and second amplifier stages are connected by a first strip line having a DC decoupling portion extending through said first partition, and said second amplifier stage and said mixer is connected by a second strip line having a DC decoupling portion extending through said second partition, each of said DC decoupling portions comprising a pair of interdigitally disposed sections each having a dimension substantially equal to the quarter wavelength of a signal propagating on said first and second strip lines.

23. A microwave frequency converter as claimed in claim 19, wherein said mixer is located in a further space and includes an image signal rejection filter in the further space, further comprising a second block of a material absorptive of electromagnetic radiation located in said further space adjacent said rejection filter.

24. A microwave frequency converter as claimed in claim 23, further comprising a block of conductive material located adjacent said rejection filter for suppressing the amount of coupling between said local oscillator and a resonance mode of said shield casing.

25. A microwave frequency converter as claimed in claim 19, further comprising a first block of electrically conductive electric shielding material extending between said first end wall and said first conductive partition adjacent to one of said side walls, the first amplifier stage and the local oscillator being respectively located in first and second spaces respectively having first and second transverse dimensions, the first transverse dimension of the first space in which said first amplifier stage is located being smaller than the second transverse dimension of the space in which said second local oscillator is disposed.

26. A microwave frequency converter as claimed in claim 25, further comprising a second block of electrically conductive electric shielding material extending between said first and second conductive partitions adjacent to one of said side walls, the second amplifier being located in a third space having a third transverse dimension, the third transverse dimension of the third space in which said second amplifier stage is located being smaller than the second transverse dimension of the second space in which said local oscillator is disposed.

27. A microwave frequency converter as claimed in claim 19, further comprising a block of electrically conductive electric shielding material extending between said first and second conductive partitions adjacent one of said side walls, the second amplifier and local oscillator being respectively located in first and second spaces having first and second transverse dimensions, the first transverse dimension of the first space in which said second amplifier stage is located being smaller than the second transverse dimension of the second space in which said local oscillator is disposed.

28. A microwave frequency converter as claimed in claim 27, wherein said end walls, side walls, top wall, said first and second conductive partitions, and said conductive blocks are formed as a one-piece construction.

29. The converter of claim 19 wherein one electrically conductive electric shielding wall of said casing has first and second faces, said dielectric substrate being disposed on said first face, said second face defining one wall of an element for coupling microwave energy to components in the casing mounted on the substrate.

30. A microwave frequency converter comprising:
a shield casing;
a dielectric substrate in said shield casing;
a super high frequency amplifier having first and second successive stages, a mixer and a local oscillator all of which are connected and arranged in the order named on said dielectric substrate between first and second end walls of said shield casing;
a first conductive partition disposed in said casing between said first and second amplifier stages;
a second conductive partition disposed in said casing between said amplifier and said mixer; and
a block of conductive material extending between said first end wall and said first conductive partition adjacent to one of said side walls, the transverse dimension of the space of which said first amplifier stage is located being smaller than the transverse dimension of the space in which said local oscillator is disposed.

31. A microwave frequency converter as claimed in claim 30, wherein said mixer includes an image signal rejection filter, further comprising a second block of a material absorptive of electromagnetic radiation located adjacent said rejection filter.

32. A microwave frequency converter as claimed in claim 31, further comprising a block of conductive material located adjacent said rejection filter for suppressing the amount of coupling between said local oscillator and a resonance mode of said shield casing.

33. A microwave frequency converter comprising:
an electrically conductive electric shield casing;
a local oscillator disposed in said casing, the oscillator including a dielectric resonator for generating a local oscillator output;

a mixer disposed in said casing, the mixer including an image signal rejection filter formed by plural open-ended stubs; and a block located on one side wall of said casing in proximity to said stubs, said block comprising a first material absorptive of electromagnetic radiation and a second electrically conductive electric shielding material.

34. A microwave integrated circuit comprising:

a shield casing having a pair of opposed first and second end walls, a pair of side walls and top and bottom walls;

a dielectric substrate on said bottom wall;

first and second interconnected integrated circuit portions arranged on said substrate between said first and second end walls;

an input strip line arranged on said substrate, the strip line having one end coupled to the input of said first integrated circuit portion and the other end terminating at a position spaced from said first end wall by a distance approximately equal to an integral multiple of the half wavelength of a signal propagating in said shield casing; and an elongated coupling member disposed in parallel with said first end wall, the coupling member extending from the other end of said input strip line to an external circuit.

35. A microwave integrated circuit as claimed in claim 34, further comprising a conductive partition disposed in said shield casing between said first and second integrated circuit portions.

36. A microwave integrated circuit as claimed in claim 35, further comprising a block of a material absorptive of electromagnetic radiation located in one of the spaces defined by said conductive partition to absorb undesired electromagnetic radiation.

37. A microwave integrated circuit as claimed in claim 36, further comprising a second block of a material absorptive of electromagnetic radiation located in the other space to absorb undesired electromagnetic radiation.

38. A microwave integrated circuit as claimed in claim 35, further comprising a block of electrically conductive electric shielding material extending between said first end wall and said first conductive partition adjacent to one of said side walls, the first amplifier stage and local oscillator being respectively located in first and second spaces respectively having first and second transverse dimensions, the first transverse dimension of the first space in which said first amplifier stage is located being smaller than the second transverse dimension of the second space in which said local oscillator is disposed.

39. A microwave integrated circuit as claimed in claim 38, wherein said end walls, side walls and top wall, said first and second conductive partitions are formed into a one-piece construction.

40. A microwave integrated circuit as claimed in claim 35, wherein said end walls, side walls and top wall, said first and second conductive partitions, and said conductive are formed into a one-piece construction.

41. A microwave integrated circuit as claimed in claim 35, wherein said first and second integrated circuit portions are connected by a strip line having a DC decoupling portion extending through said partition, said DC decoupling portion comprising a pair of interdigitally disposed sections each having a dimension substantially equal to the quarter wavelength of a signal propagating on said strip line.

42. A microwave integrated circuit as claimed in claim 34, further comprising a waveguide connected in use between said coupling member and said external circuit, said waveguide being disposed parallel with the bottom wall of said shield casing, said waveguide having an opening located adjacent to said second end wall.

43. A microwave frequency converter comprising:

a shield casing;

a dielectric substrate in said shield casing;

a super high frequency amplifier having first and second successive stages, a mixer and a local oscillator all of which are connected and arranged in the order named on said dielectric substrate between first and second end walls of said shield casing;

a first conductive partition disposed in said casing between said first and second amplifier stages;

a second conductive partition disposed in said casing between said amplifier and said mixer; and a block of conductive material extending between said first and second conductive partitions adjacent to one of said side walls, the transverse dimension of the space in which said second amplifier stage is located being smaller than the transverse dimension of the space in which said local oscillator is disposed.

44. A microwave frequency converter comprising:

a shield casing;

a dielectric substrate in said shield casing;

a super high frequency amplifier having first and second successive stages, a mixer and a local oscillator all of which are connected and arranged in the order named on said dielectric substrate between first and second end walls of said shield casing;

a first conductive partition disposed in said casing between said first and second amplifier stages;

a second conductive partition disposed in said casing between said amplifier and said mixer;

a first strip line having a DC decoupling portion extending through said first partition, said first strip line connecting said first and second amplifier stages; and a second strip line having a DC decoupling portion extending through said second partition, said second strip line connecting said second amplifier stage and said mixer, each of said DC decoupling portions comprising a pair of interdigitally disposed sections each having a dimension substantially equal to the quarter wavelength of a signal propagating on said first and second strip lines.

45. A microwave circuit comprising:

an enclosed shield casing having a metal end wall and another metal wall, the metal end and another walls forming the shield casing, a dielectric substrate on said another wall, integrated circuit means for deriving microwave energy in a predetermined frequency range mounted on said substrate and having a terminal for carrying energy in said frequency range, a strip line for carrying energy in said frequency range and having one end connected to said terminal, said strip line being disposed on said substrate so it extends at right angles to the end wall, said strip line having another end terminating at a position in the casing spaced an integral multiple of one-half wavelength of a frequency in the predetermined frequency range from the end wall, and an elongated microwave coupling member disposed parallel with said end wall, the coupling member extending from the another end of said strip line for connection to an external circuit operating in said frequency range.

* * * * *